(12) United States Patent
Chen (10) Patent No.: US 8,947,286 B2
(45) Date of Patent: Feb. 3, 2015

(54) ANALOG/DIGITAL CONVERTER

(71) Applicant: Fujitsu Limited, Kawasaki-shi, Kanagawa (JP)

(72) Inventor: Yanfei Chen, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/070,913

(22) Filed: Nov. 4, 2013

(65) Prior Publication Data

US 2014/0184434 A1 Jul. 3, 2014

(30) Foreign Application Priority Data

Dec. 28, 2012 (JP) ................................. 2012-288479

(51) Int. Cl.
*H03M 1/38* (2006.01)
*H03M 1/00* (2006.01)

(52) U.S. Cl.
CPC ..................... *H03M 1/002* (2013.01)
USPC ........... 341/161; 341/118; 341/120; 341/155; 341/156; 341/172

(58) Field of Classification Search
CPC ... H03M 1/44; H03M 1/0695; H03M 1/0682; H03M 1/164; H03M 1/442; H03M 1/0607; H03M 1/12; H03M 1/165; H03M 1/361; H03M 2201/225
USPC .................. 341/118, 120, 155, 156, 161, 172
See application file for complete search history.

(56) References Cited

U.S. PATENT DOCUMENTS

| 4,999,633 | A | | 3/1991 | Draxelmayr | |
|---|---|---|---|---|---|
| 6,124,818 | A | * | 9/2000 | Thomas et al. | ............... 341/155 |
| 6,366,230 | B1 | * | 4/2002 | Zhang et al. | ................... 341/162 |
| 6,806,745 | B2 | * | 10/2004 | Fujimoto | ......................... 327/94 |
| 6,879,277 | B1 | * | 4/2005 | Cai | ................... 341/155 |
| 7,397,409 | B2 | * | 7/2008 | Jeon et al. | ..................... 341/156 |
| 7,948,410 | B2 | * | 5/2011 | Venkataraman et al. | ..... 341/122 |
| 7,969,334 | B2 | * | 6/2011 | Kiran et al. | ................... 341/118 |
| 7,978,117 | B2 | * | 7/2011 | Jeon et al. | ..................... 341/163 |
| 8,299,952 | B1 | * | 10/2012 | Lin et al. | ..................... 341/172 |
| 8,686,888 | B2 | * | 4/2014 | Chou et al. | ..................... 341/161 |
| 2008/0198057 | A1 | * | 8/2008 | Kurauchi | ...................... 341/155 |

FOREIGN PATENT DOCUMENTS

JP 2-155457 A 6/1990

OTHER PUBLICATIONS

Christopher Peter Hurrell, et al., "An 18 b 12.5 MS/s ADC with 93 dB SNR", IEEE Journal of Solid-State Circuits, Dec. 2010, pp. 2647-2654, vol. 45, No. 12.

(Continued)

*Primary Examiner* — Linh Nguyen
(74) *Attorney, Agent, or Firm* — Arent Fox LLP (57) ABSTRACT

An analog/digital converter includes: a first analog/digital conversion unit that performs digital conversion on received first analog input voltage in a first time period; a second analog/digital conversion unit that performs digital conversion on received second analog input voltage in a second time period that is different from the first time period; and a first coupling capacitor that connects the first analog/digital conversion unit and the second analog/digital conversion unit, and wherein the second analog/digital conversion unit receives, through the first coupling capacitor, first residual voltage that is remaining voltage of the first analog input voltage on which digital conversion is performed in the first analog/digital conversion unit, as the second analog input voltage.

18 Claims, 10 Drawing Sheets

(56) References Cited

OTHER PUBLICATIONS

Masanori Furuta, et al., "A 10-bit, 40-MS/s, 1.21 mW Pipelined SAR ADC Using Single-Ended 1.5-bit/cycle Conversion Technique", IEEE Journal of Solid-State Circuits, Jun. 2011, pp. 1360-1370, vol. 46, No. 6.

Yanfei Chen, et al., "Split Capacitor DAC Mismatch Calibration in Successive Approximation ADC", IEEE 2009 Custom Integrated Circuits Conference (CICC), 2009, pp. 279-282.

* cited by examiner

ANALOG/DIGITAL CONVERTER

CROSS-REFERENCE TO RELATED APPLICATION

This application is based upon and claims the benefit of priority from the prior Japanese Patent Application No. 2012-288479 filed on Dec. 28, 2012, the entire contents of which are incorporated herein by reference.

FIELD

The embodiments discussed herein are related to an analog/digital converter (ADC).

BACKGROUND

An ADC has been widely used in various fields, and for example, has come to be built in battery-powered portable electronic equipment, a micro controller unit (MCU) that is used for various electronic devices, and the like. Therefore, it is desirable that the power consumption and the footprint of the ADC are reduced.

In the related art, for example, as an ADC with low-power consumption, a successive approximation register (SAR) ADC using a capacitor digital/analog converter (capacitor DAC) is known.

Such an SAR ADC includes the capacitor DAC, a comparator, and a control logic circuit (SAR logic circuit), and improves the resolution by repeating comparison processing by the comparator several times.

In addition, in the related art, for example, a pipelined ADC has been proposed in which a plurality of AD conversion units are connected to each other in multi-stages and executes a pipeline operation, so that the number of comparators is reduced while the operation speed is maintained.

In addition, recently, a pipelined SAR ADC has been also proposed in order to improve the power consumption and the processing speed in the pipelined ADC.

In the related art, various ADCs have been proposed such as the pipelined SAR ADC and an SAR ADC in which capacitor mismatch of a used capacitor DAC (switched capacitor circuit) is reduced.

C. P. Hurrell et al., "An 18 b 12.5 MS/s ADC With 93 dB SNR," IEEE Journal of Solid-State Circuits, vol. 45, No. 12, December 2010, M. Furuta et al., "A 10-bit, 40-MS/s, 1.21 mW Pipelined SAR ADC Using Single-Ended 1.5-bit/cycle Conversion Technique," IEEE Journal of Solid-State Circuits, vol. 46, No. 6, June 2011, and Y. Chen et al., "Split Capacitor DAC Mismatch Calibration in Successive Approximation ADC," IEEE 2009 Custom Integrated Circuits Conference (CICC), pp. 279-282, September 2009 are the related arts.

In the related art, there has been proposed that the pipelined SAR ADC that includes the AD conversion units in multi-stages, and an amplifier is provided between the stages of the AD conversion units that execute the pipeline processing.

The amplifier (residue amplifier) that is provided between the stages receives, as an input, the remaining analog signal (residual voltage) of an analog signal on which digital conversion has been performed by a certain bit portion in the previous AD conversion unit, amplifies the residual voltage, and outputs the amplified voltage to the latter AD conversion unit.

However, there is a problem, for example, in the ADC that is built in battery-powered portable electronic equipment, an MCU, and the like because the residue amplifier that is provided between the stages causes an increase in the power consumption and the footprint.

SUMMARY

According to an aspect of the invention, An analog/digital converter includes: a first analog/digital conversion unit that performs digital conversion on received first analog input voltage in a first time period; a second analog/digital conversion unit that performs digital conversion on received second analog input voltage in a second time period that is different from the first time period; and a first coupling capacitor that connects the first analog/digital conversion unit and the second analog/digital conversion unit, and wherein the second analog/digital conversion unit receives, through the first coupling capacitor, first residual voltage that is remaining voltage of the first analog input voltage on which digital conversion is performed in the first analog/digital conversion unit, as the second analog input voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Here, an example of a pipelined SAR ADC and the problems of the pipelined SAR ADC are described with reference to FIG. 1, and an embodiment of an ADC is described in detail later.

Figure 1:
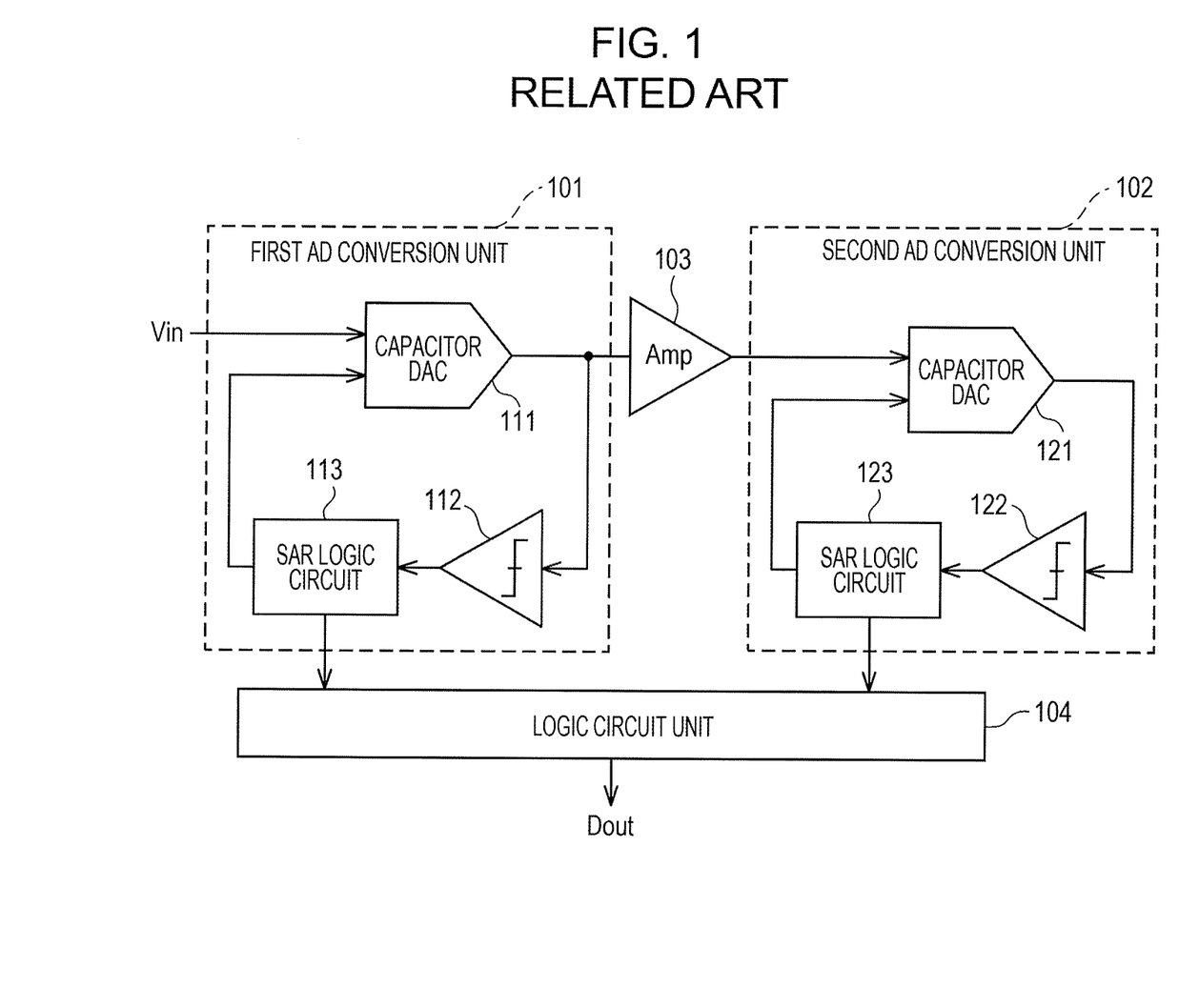
FIG. 1 is a block diagram illustrating an example of a pipelined SAR ADC.

FIG. 1 is a block diagram illustrating a pipelined SAR ADC that includes two pipeline stages (AD conversion units). In FIG. 1, the pipelined SAR ADC includes a first AD conversion unit 101, a second AD conversion unit 102, an amplifier (residue amplifier: Amp) 103, and a logic circuit unit 104.

As illustrated in FIG. 1, the first AD conversion unit 101 includes a capacitor DAC 111, a comparator 112, and a logic circuit (SAR logic circuit) 113. Similarly, the second AD conversion unit 102 includes a capacitor DAC 121, a comparator 122, and an SAR logic circuit 123.

The first AD conversion unit 101 receives an input analog signal (voltage) Vin and converts the signal into digital data by a certain bit portion. In addition, the second AD conversion unit 102 receives the output from the first AD conversion unit 101 through the amplifier 103.

That is, the amplifier 103 amplifies the remaining voltage (residual voltage) that is obtained by subtracting voltage that corresponds to the digital data that is converted in the first AD conversion unit 101 from the input analog signal Vin, and the second AD conversion unit 102 receives the amplified voltage.

In addition, the second AD conversion unit 102 performs AD conversion processing on the residual voltage of the first AD conversion unit 101, which has been amplified by the amplifier 103.

In the logic circuit unit 104, logic processing in which gain or the like of the amplifier 103 is considered is performed on the data that has been converted into the digital value by the first AD conversion unit 101 and the second AD conversion unit 102, and the data is output as a digital output Dout.

Here, the AD conversion processing that is performed in each of the first AD conversion unit 101 and the second stage 102 AD conversion unit is similar to processing of an ADC that is called an SAR ADC or a charge redistribution SAR ADC.

In the ADC that is described with reference to FIG. 1, the amplifier 103 that amplifies the residual voltage in the first AD conversion unit 101 and outputs the amplified residual voltage to the second AD conversion unit 102 is provided between the first AD conversion unit 101 and the second AD conversion unit 102.

As described above, the ADC has been built, for example, in battery-powered portable electronic equipment, an MCU, and the like, and it is desirable that the power consumption and the footprint are reduced.

In the embodiments, mainly, a two-stage pipelined SAR ADC and a three-stage pipelined SAR ADC are described, and the embodiments are not limited to such illustrated examples and may be applied to various ADCs.

For example, the embodiments may be also applied to an ADC that includes two AD conversion units (pipeline stages) and another system of an AD conversion unit that is provided in the upstream or downstream of the two stages.

Figure 2:
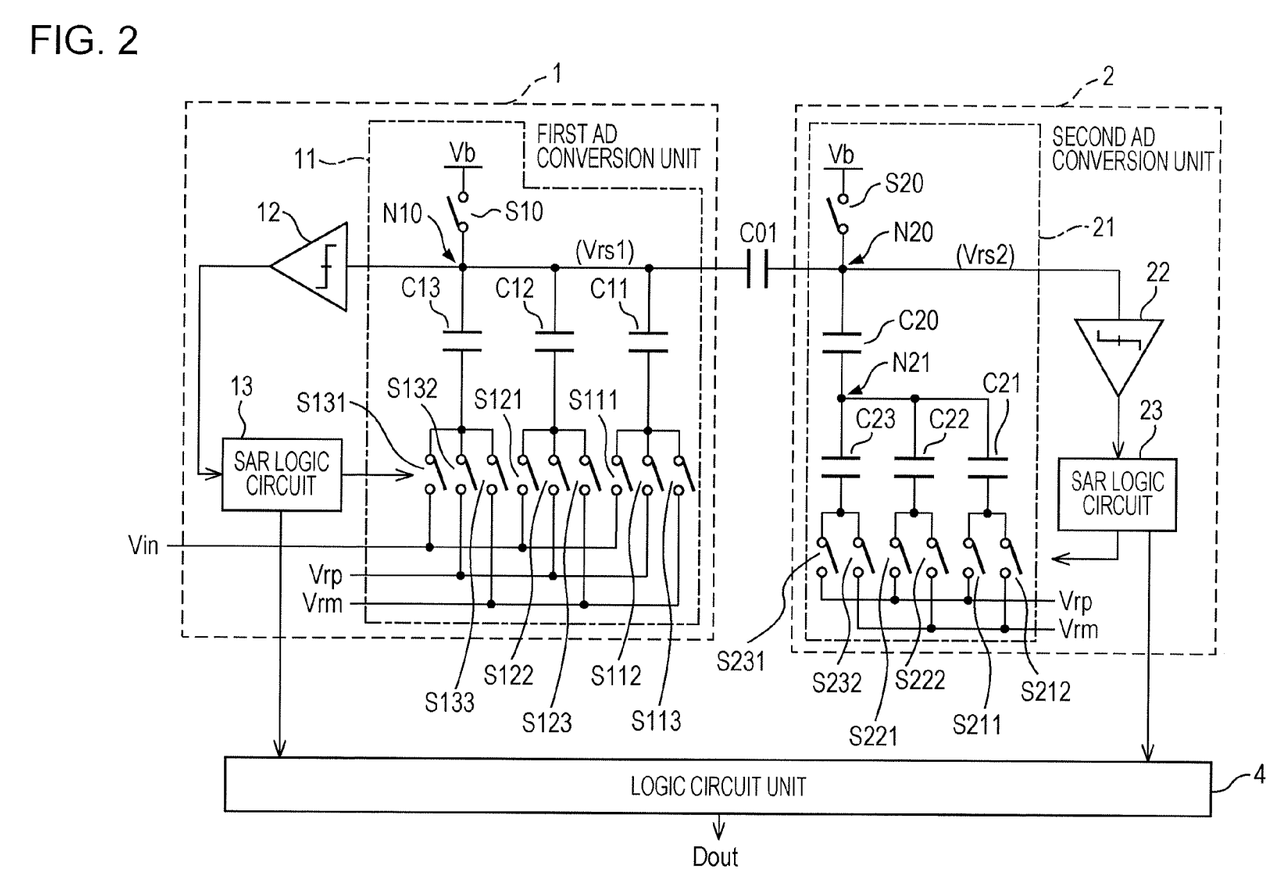
FIG. 2 is a circuit diagram illustrating an ADC according to a first embodiment.

The embodiments of an ADC are described below in detail with reference to accompanying drawings. FIG. 2 is a circuit diagram illustrating an ADC according to a first embodiment, and which is a pipelined SAR ADC that includes two pipeline stages (AD conversion units).

In FIG. 2, the pipelined SAR ADC includes a first AD conversion unit 1, a second AD conversion unit 2, and a logic circuit unit 4.

As illustrated in FIG. 2, the first AD conversion unit 1 includes a capacitor DAC 11, a comparator 12, and a logic circuit (SAR logic circuit) 13. In addition, the second AD conversion unit 2 includes a capacitor DAC 21, a comparator 22, and an SAR logic circuit 23.

A coupling capacitor C01 is provided between the first AD conversion unit 1 and the second AD conversion unit 2. That is, in place of the residue amplifier (amplifier 103) that is described above with reference to FIG. 1, the coupling capacitor C01 is provided between the first AD conversion unit 1 and the second AD conversion unit 2.

The capacitor DAC 11 in the first AD conversion unit 1 includes capacitors C11, C12, and C13, and switches S111 to S113, S121 to S123, S131 to S133, and S10. One end (top plate) of each of the capacitors C11, C12, and C13 is connected to a node N10 in common, and bias voltage Vb is applied to the node N10 through the switch S10.

To the other end (bottom plate) of each of the capacitors C11, C12, and C13, input voltage (input signal) Vin is applied through the switches S111, S121, and S131, positive reference voltage Vrp is applied through the switches S112, S122, and S132, or negative reference voltage Vrm is applied through switches S113, S123, and S133, selectively.

The capacitor DAC 21 in the second AD conversion unit 2 includes capacitors C21, C22, C23, and C20, and switches S211, S212, S221, S222, S231, S232, and S20.

One end (top plate) of each of the capacitors C21, C22, and C23 is connected to a node N21 in common, and one end of the capacitor (reference voltage adjustment capacitor) C20 the other end of which is connected to an node N20 is connected to the node N21. Bias voltage Vb is applied to the node N20 through the switch S20.

To the other end (bottom plate) of each of the capacitors C21, C22, and C23, positive reference voltage Vrp is applied through the switches S211, S221, and S231, or negative reference voltage Vrm is applied through the switches S212, S222, and S232, selectively.

As described above, the switches S111 to S113, S121 to S123, S131 to S133, and S10 are controlled by the SAR logic circuit 13, and the switches S211, S212, S221, S222, S231, S232, and S20 are controlled by the SAR logic circuit 23.

The coupling capacitor C01 is provided between the first AD conversion unit 1 and the second AD conversion unit 2, that is, between the node N10 of the capacitor DAC 11 in the first AD conversion unit 1 and the node N20 of the capacitor DAC 21 in the second AD conversion unit 2.

As described above, in the ADC according to the first embodiment, the amplifier in the pipelined SAR ADC that is described above with reference to FIG. 1 is not provided, and the first AD conversion unit 1 and the second AD conversion unit 2 are connected to each other through the coupling capacitor C01.

Here, in the capacitors C11, C12, and C13, for example, the capacitor value is set at a power of 2 (binary), and in the capacitors C21, C22, and C23, for example, the capacitor value is set at a power of 2.

In the capacitors C11 to C13, and the capacitors C21 to C23, the capacitor value is not limited to power of 2 and may be set in accordance with architectures of the known various SAR ADCs (charge redistribution SAR ADCs).

In addition, the capacitor DACs 11 and 12 are not limited to the illustrated example, and for example, various capacitor DACs such as a capacitor DAC that includes a plurality of capacitors that includes a dummy capacitor and in which the weights of the capacitor values correspond to 1:1:2:4:8: . . . , may be applied to the embodiment.

Figure 3:
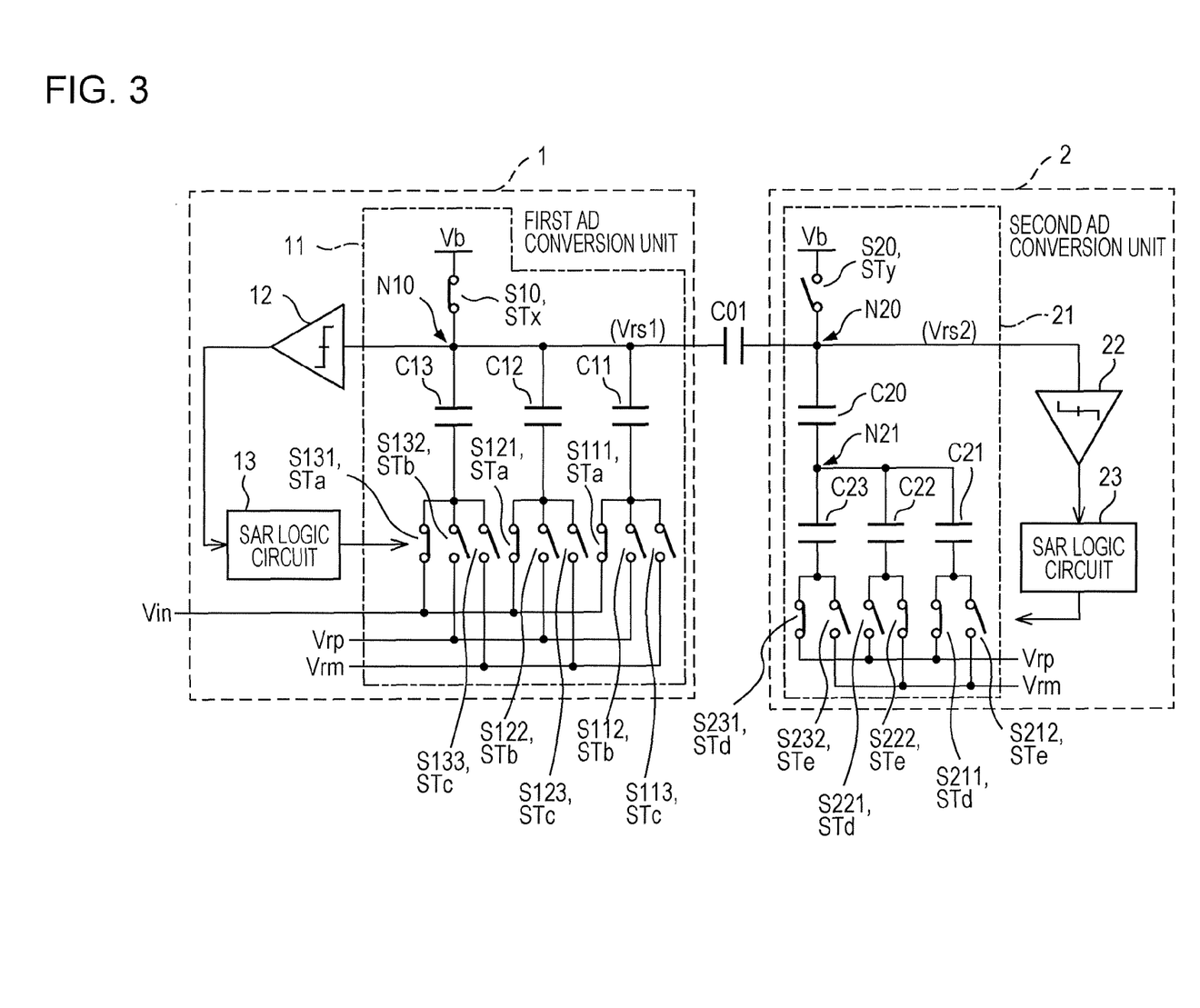
FIG. 3 is a circuit diagram illustrating an operation of the ADC illustrated in FIG. 2.
Figure 4:
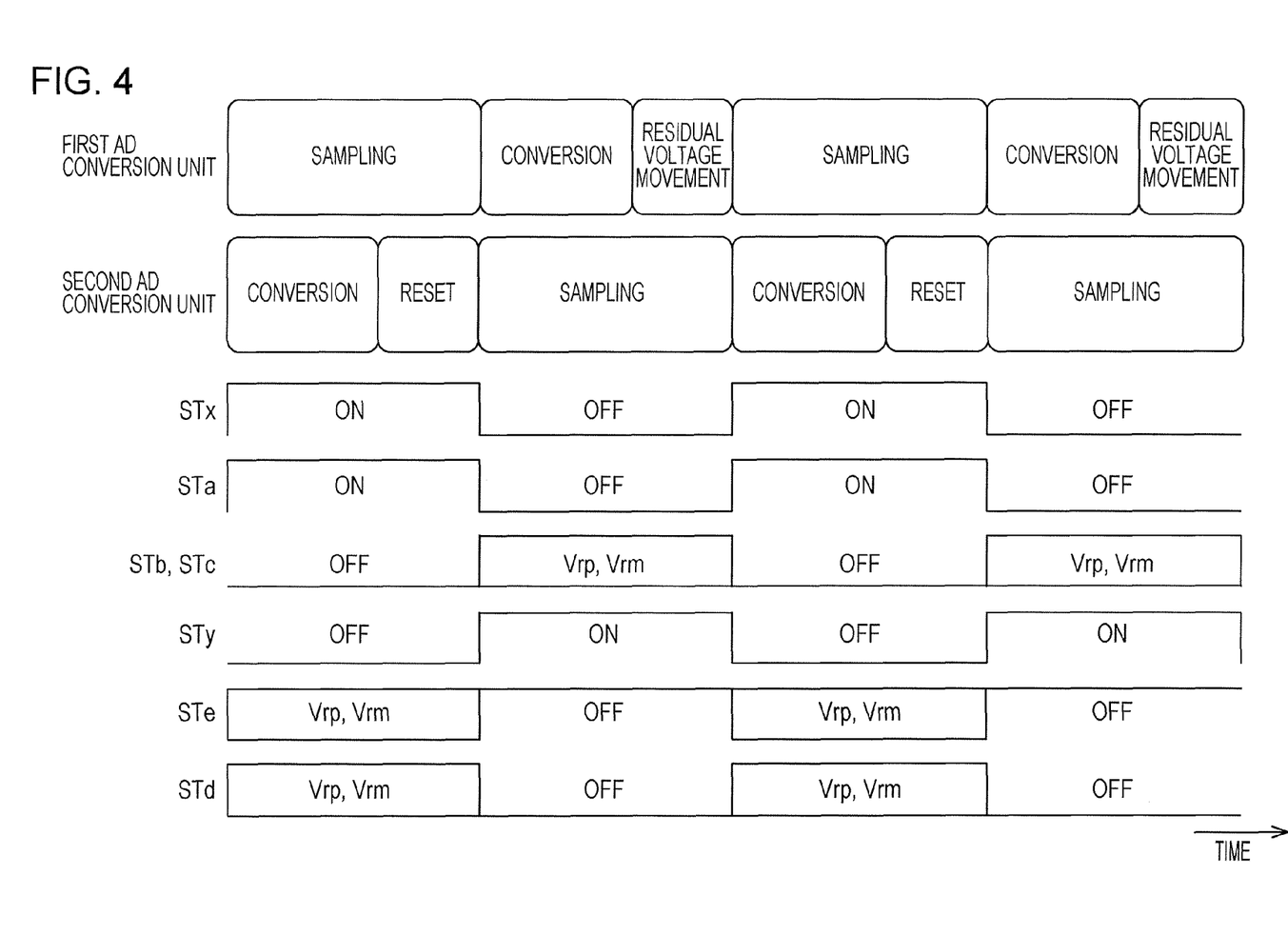
FIG. 4 is a timing diagram illustrating the operation of the ADC illustrated in FIG. 3.

FIG. 3 is a circuit diagram illustrating an operation of the ADC illustrated in FIG. 2, and FIG. 4 is a timing diagram illustrating the operation of the ADC illustrated in FIG. 3.

Here, FIG. 3 illustrates the first AD conversion unit 1 with the operation states of the switches S111 to S113, S121 to S123, S131 to S133, and S10, and the second AD conversion unit 2 with the operation states of the switches S211, S212, S221, S222, S231, S232, and S20.

In the capacitor DAC 11, the switches S111, S121, and S131 operate in accordance with an operation state STa, the switches S112, S122, and S132 operate in accordance with an operation state STb, and the switches S113, S123, and S133 operate in accordance with an operation state STc. In addition, the switch S10 operates in accordance with an operation state STx.

Similarly, in the capacitor DAC 21, the switches S211, S221, and S231 operate in accordance with an operation state STd, and the switches S212, S222, and S232 operate in accordance with an operation state STe. In addition, the switch S20 operates in accordance with an operation state STy.

That is, as illustrated in FIG. 4, in a sampling state in which the first AD conversion unit (first pipeline stage) 1 executes sampling processing, the switch S10 is turned on (STx), and all of the switches S111, S121, and S131 are turned on (STa). At that time, all of the switches S112, S122, S132, S113, S123, and S133 are turned off (STb and STc).

Therefore, bias voltage Vb and analog input voltage (input signal) Vin are applied to both ends of each of the capacitors C11, C12, and C13, and each of the capacitors C11, C12, and C13 samples and holds the input voltage.

Here, when the first AD conversion unit 1 is in the sampling state, the second AD conversion unit (second pipeline stage) 2 becomes in a conversion state in which digital conversion processing is executed (in the first half) and in a reset state in which reset processing is executed (in the latter half).

That is, when the second AD conversion unit 2 corresponds to the last stage, the reset processing is executed for the residual voltage (second residual voltage Vrs2) that is the remaining voltage of input voltage on which digital conversion is performed (for example, by the three least significant bits) in the second AD conversion unit 2 because there is no subsequent AD conversion unit.

When the sampling and holding of the input analog signal by the first AD conversion unit 1 (capacitors C11, C12, and C13) is finished, the first AD conversion unit 1 becomes in the conversion state in which the digital conversion processing is executed (in the first half) and in a residual voltage movement state in which movement processing of the residual voltage is executed (in the latter half). When the first AD conversion unit 1 is in the conversion state and the residual voltage movement state, the second AD conversion unit 2 becomes in the sampling state, as described in detail later.

When the first AD conversion unit 1 becomes in the conversion state, the switch S10 is turned off (STx), all of the switches S111, S121, and S131 are turned off (STa). Therefore, the node N10 to which one end of each of the capacitors C11, C12, and C13 is connected in common becomes in a floating (high impedance) state.

At that time, switching control is performed on each of the switches S112, S122, S132, S113, S123, and S133 so that each of the switches selects the positive reference voltage Vrp (switches S112, S122, and S132 are turned on) or the negative reference voltage Vrm (switches S113, S123, and S133 are turned on).

Therefore, to the other end of each of the capacitors C11, C12, and C13, the analog voltage (Vrp or Vrm) is applied, which is selected in accordance with a digital value (value of the three most significant bits in FIG. 3) that is defined by the input voltage Vin, and the first AD conversion unit 1 becomes in the residual voltage movement state.

Here, when the first AD conversion unit 1 is in the conversion state and the residual voltage movement state, the second AD conversion unit 2 is in the sampling state, the switch S20 is turned on (STy), and all of the switches S211, S221, S231, S212, S222, and S232 are turned off (STd and STe).

Therefore, the bias voltage Vb is applied to one end (node N20) of the coupling capacitor C01 the other end of which is connected to the node N10, and the residual voltage in the first AD conversion unit 1 is sampled and held by the coupling capacitor C01.

That is, the first AD conversion unit 1 performs digital conversion on an input analog signal by a certain bit portion (three most significant bits), and the remaining analog signal (residual voltage Vrs1) moves to the coupling capacitor C01 to be sampled and held.

The first AD conversion unit 1 becomes in the sampling state again after the conversion state and the residual voltage movement state, and as described above, all of the switches S10, S111, S121, and S131 are turned on, and all of the switches S112, S122, S132, S113, S123, and S133 are turned off.

When the first AD conversion unit 1 is in the sampling state, the second AD conversion unit 2 becomes in the conversion state and the reset state. At that time, the switch S20 is turned off, and switching control is performed on each of the switches S211, S221, S231, S212, S222, and S232 so that each of the switches selects the positive reference voltage Vrp (switches S211, S221, and S231 are turned on), or negative reference voltage Vrm (switches S212, S222, and S232 are turned on).

Therefore, the analog voltage (Vrp or Vrm) that is selected in accordance with a digital value (value of the three least significant bits in FIG. 3) that is defined by the residual voltage (Vrs1) that is held in the coupling capacitor C01 is applied to the other end of each of the capacitors C21, C22, and C23.

Here, the capacitor C20 that is provided between the other end (node N20) of the coupling capacitor C01 and the common connection node N21 of the capacitors C21, C22, and C23 is employed in order to allow the same reference voltage Vrp and reference voltage Vrm to be used in the first AD conversion unit 1 and the second AD conversion unit 2. Therefore, the capacitor C20 functions as a reference voltage adjustment capacitor that is used to adjust the reference voltage.

That is, a capacitor value of the capacitor C20 is set so that the positive reference voltage Vrp and the negative reference voltage Vrm that are used to define a digital value of the three most significant bits by the capacitor DAC 11 are allowed to be used to define a digital value of the three least significant bits by the capacitor DAC 21.

For example, a capacitor value of the coupling capacitor C01 is represented as CC01, a capacitor value of the capacitor C20 is represented as CC20, a total capacitor value of the capacitors C21, C22, and C23 is represented as CC2a, and a charge that is sampled and held in the coupling capacitor C01 (charge of the node N20) is represented as Q20.

At that time, when residual voltage of the first AD conversion unit 1 is represented as Vrs1, a charge Q20s of the node N20 in the sampling state of the second AD conversion unit 2 may be represented by the following equation (1).

$$Q20s=(Vrs1-Vb)\times CC01+(Vrm-Vb)\times\{(CC20\times CC2a)/(CC20+CC2a)\} \quad (1)$$

In addition, a charge Q20e of the node N20 at timing at which the conversion state of the second AD conversion unit 2 is finished is represented by the following equation (2).

$$Q20e=(Vrp-Vb)\times\{(CC20\times CC2a)/(CC20+CC2a)\} \quad (2)$$

Here, the residual voltage Vrs of the first AD conversion unit 1 becomes equal to voltage ($V_{1LSB}$) of the least significant bit (for example, the third bit from the most significant bit) on which the digital conversion is performed in the first AD conversion unit 1.

Therefore, "Vrs1=$V_{1LSB}$" is satisfied, and the following equation (3) is obtained in accordance with the basic relationship between charge, voltage, and capacitance.

$$Q20s=Q20e \Rightarrow$$

$$(V_{1LSB}-Vb) \times CC01 = (Vrp-Vrm) \times \{(CC20 \times CC2a)/(CC20+CC2a)\} \quad (3)$$

As described above, the capacitor value CC20 that satisfies the above-described equation (3) is set to the capacitor C20 in the second AD conversion unit 2.

In the first embodiment illustrated in FIGS. 2 to 4, the capacitor DAC 11 includes the capacitors C11, C12, and C13, the capacitor DAC 21 includes capacitors C20, C21, C22, and C23, an input signal is converted into a digital value of 6 bits, and the embodiments are not limited to such examples, and the examples may be changed as appropriate.

Figure 5:
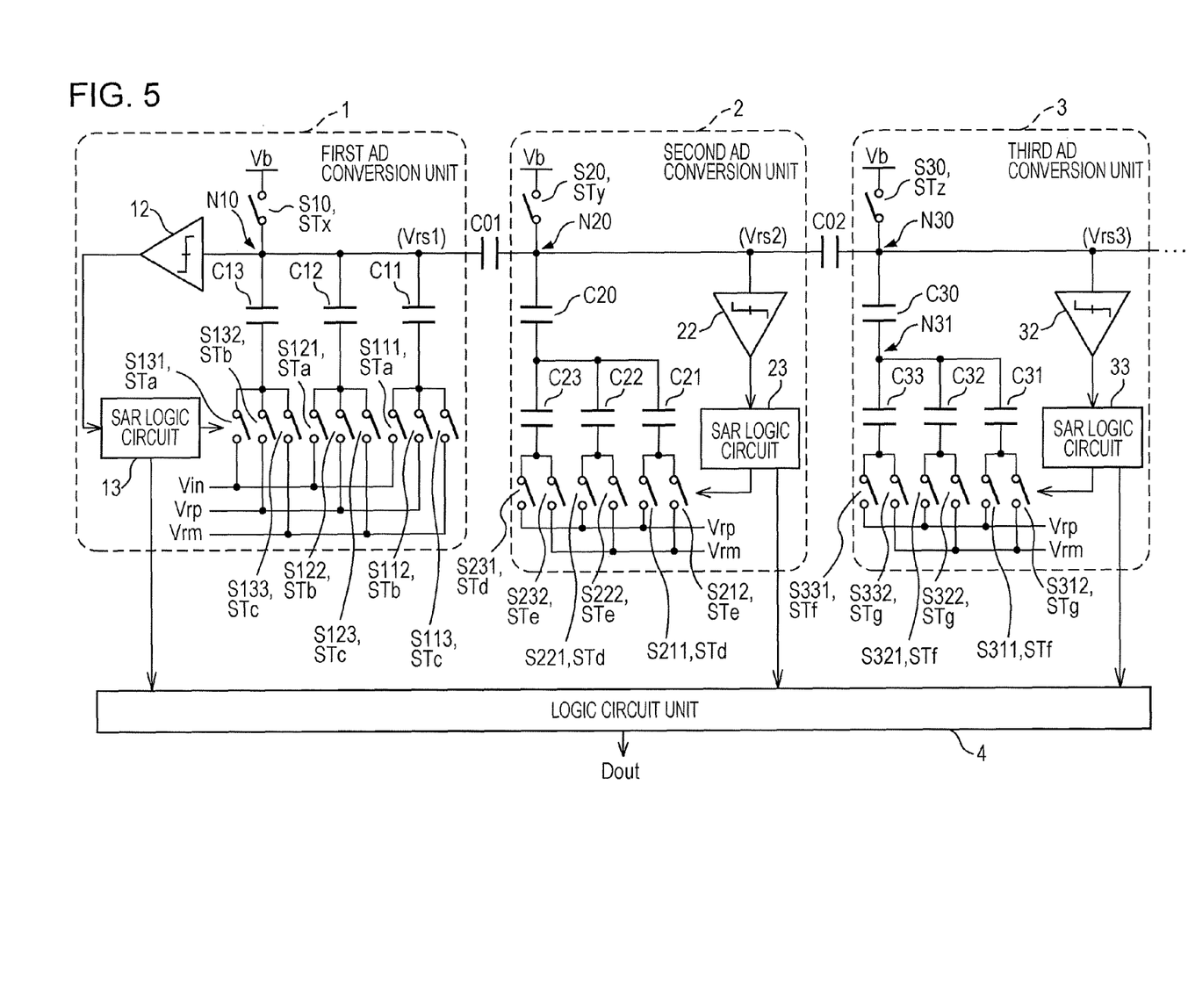
FIG. 5 is a circuit diagram illustrating an ADC according to a second embodiment.
Figure 6:
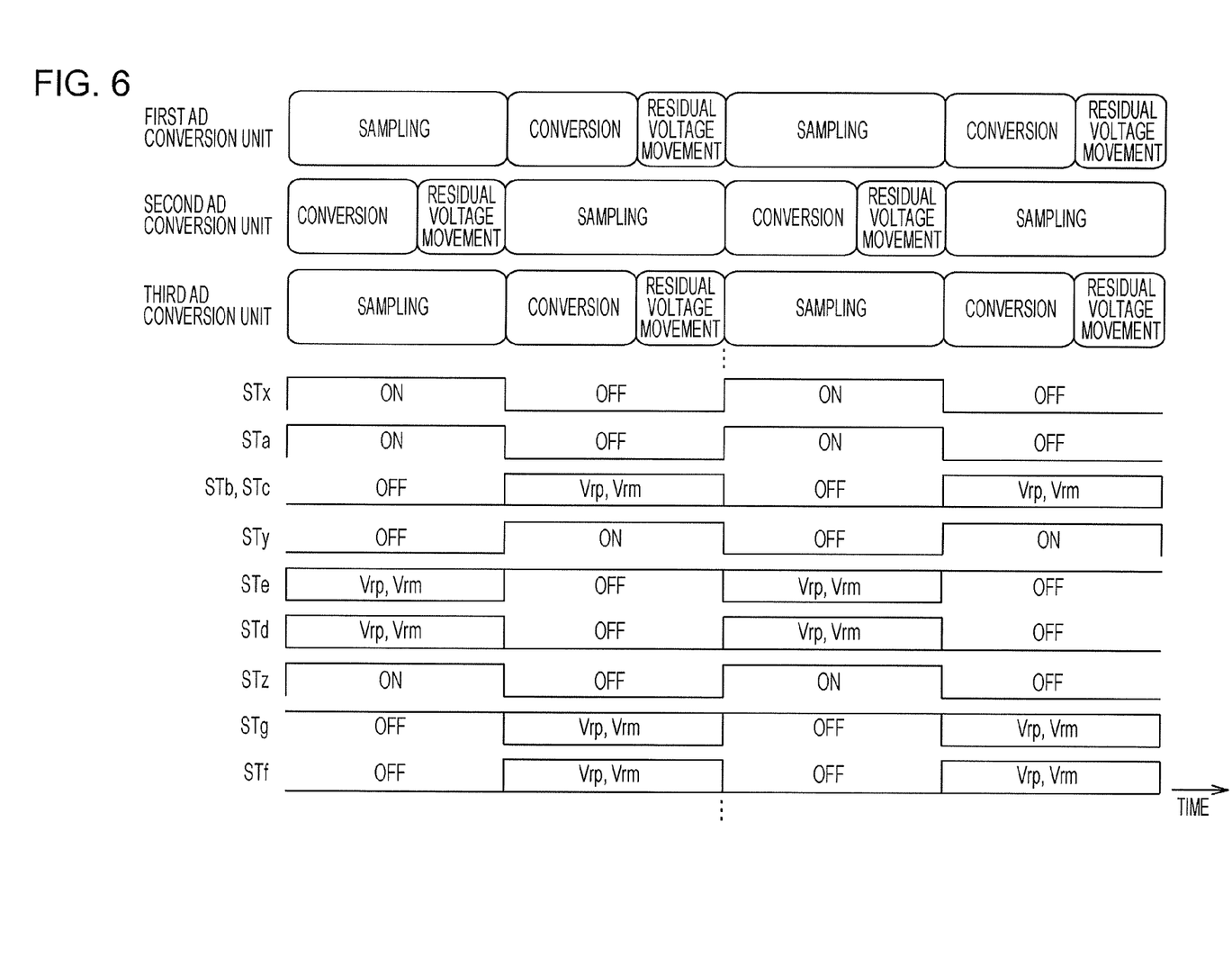
FIG. 6 is a timing diagram illustrating an operation of the ADC illustrated in FIG. 5.

FIG. 5 is a circuit diagram illustrating an ADC (pipelined SAR ADC) according to a second embodiment, and FIG. 6 is a timing diagram illustrating an operation of the ADC illustrated in FIG. 5.

That is, in the above-described first embodiment, the pipelined SAR ADC includes the two AD conversion units 1 and 2, and in the second embodiment, the pipelined SAR ADC includes three or more of pipeline stages (AD conversion units) 1, 2, 3, and the like.

In FIG. 5, the pipelined SAR ADC according to the second embodiment includes a first AD conversion unit 1, a second AD conversion unit 2, a third AD conversion unit 3, and a logic circuit unit 4. Here, in a case in which "k" is 3 or more of an integer, for example, when the kth analog/digital conversion unit is the third AD conversion unit 3, the k–1th analog/digital conversion unit is the second AD conversion unit 2.

As is apparent from a comparison of FIGS. 3 and 5, the first AD conversion unit 1 and the second AD conversion unit 2 according to the second embodiment are similar to the above-described AD conversion units according to the first embodiment. In addition, the third AD conversion unit 3 is similar to the second AD conversion unit 2, and the fourth AD conversion unit and the subsequent AD conversion units are also similar to the second or third AD conversion unit.

Here, a coupling capacitor C02 is provided between the second AD conversion unit 2 and the third AD conversion unit 3. That is, between the second AD conversion unit 2 and the third AD conversion unit 3, the coupling capacitor C02 is provided in place of the residue amplifier.

In the fourth AD conversion unit and the subsequent AD conversion units, between adjacent AD conversion units, a coupling capacitor is provided.

In the third AD conversion unit 3, between the other end (node N30) of the coupling capacitor C02 and a common connection node N31 of the capacitors C31, C32, and C33, a capacitor C30 is provided. The capacitor C30 is used to allow the same reference voltage Vrp and reference voltage Vrm as the first AD conversion unit 1 and the second AD conversion unit 2 to be used even in the third AD conversion unit 3, and functions as a reference voltage adjustment capacitor.

For example, in order to allow the same reference voltage Vrp and reference voltage Vrm as the first and second AD conversion units to be used even in the fourth AD conversion unit and the subsequent AD conversion units, a capacitor is provided between the other end of a coupling capacitor and a common connection node of capacitors that determine a digital value.

As is apparent from a comparison of FIGS. 6 and 4, operations of the first AD conversion unit 1 and the second AD conversion unit 2 in the ADC illustrated in FIG. 5 are similar to the operations of the above-described AD conversion units in the ADC according to first embodiment.

As illustrated in FIG. 6, an operation of the third AD conversion unit 3 in the ADC according to the second embodiment corresponds to an operation that is obtained by shifting the operation of the second AD conversion unit 2 by a sampling interval.

Here, when the third AD conversion unit 3 corresponds to the last stage, in the third AD conversion unit 3, the movement processing of residual voltage (third residual voltage) Vrs3 is not executed, and the reset processing is executed similar to the second AD conversion unit 2 according to the first embodiment.

That is, the last AD conversion unit that obtains the least significant bit (LSB) does not moves the residual voltage to the next stage AD conversion unit through a coupling capacitor because the next stage AD conversion unit does not exist, so that the reset processing is merely executed.

In the fourth AD conversion unit and the subsequent AD conversion units, an operation of an even-numbered AD conversion unit is similar to the operation of the second AD conversion unit 2, and an operation of an odd-numbered AD conversion unit is similar to the operation of the third AD conversion unit 3. As described above, in the last AD conversion unit, the reset processing is executed without the movement processing of residual voltage.

Figure 7:
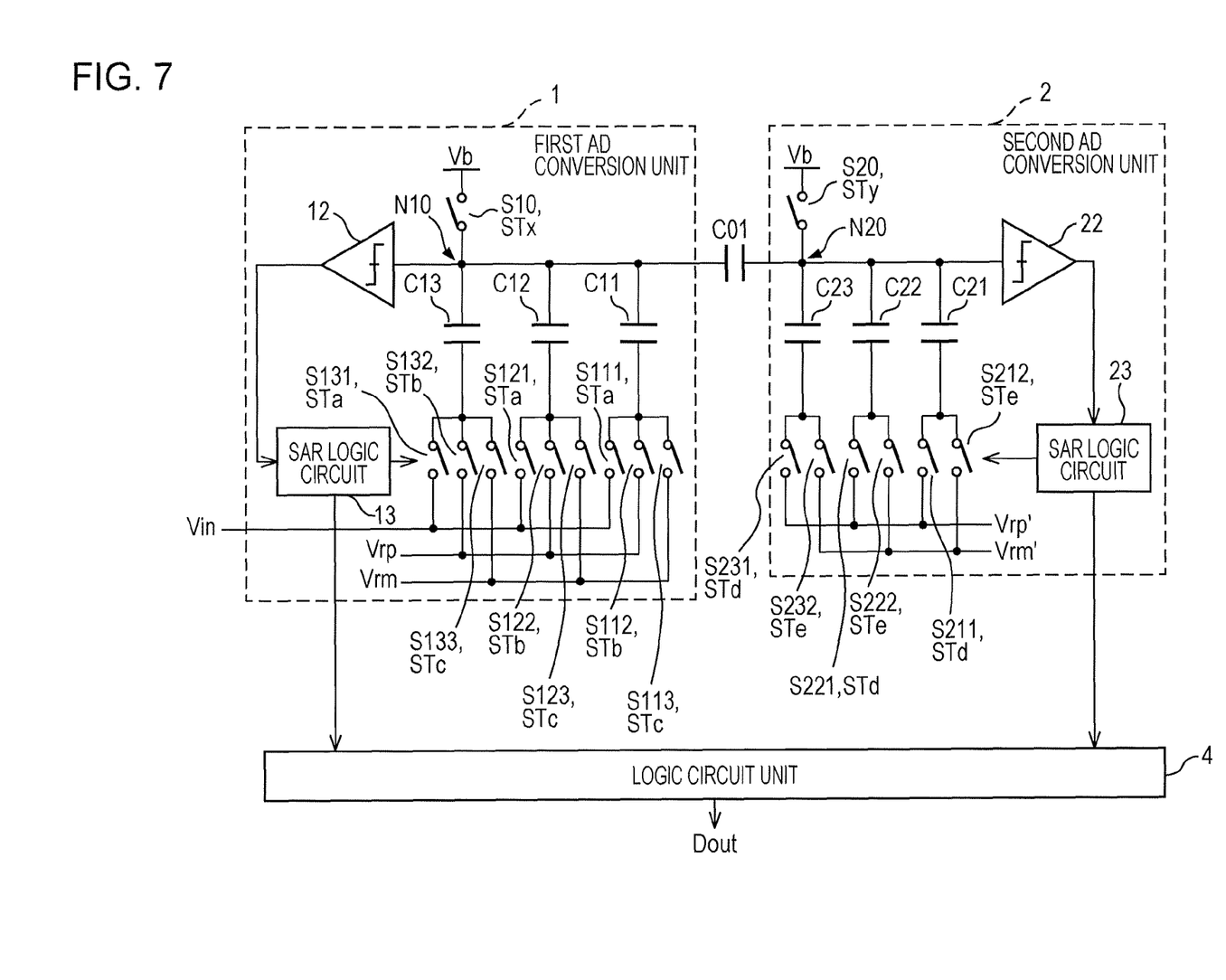
FIG. 7 is a circuit diagram illustrating an AD converter according to a third embodiment.
Figure 8:
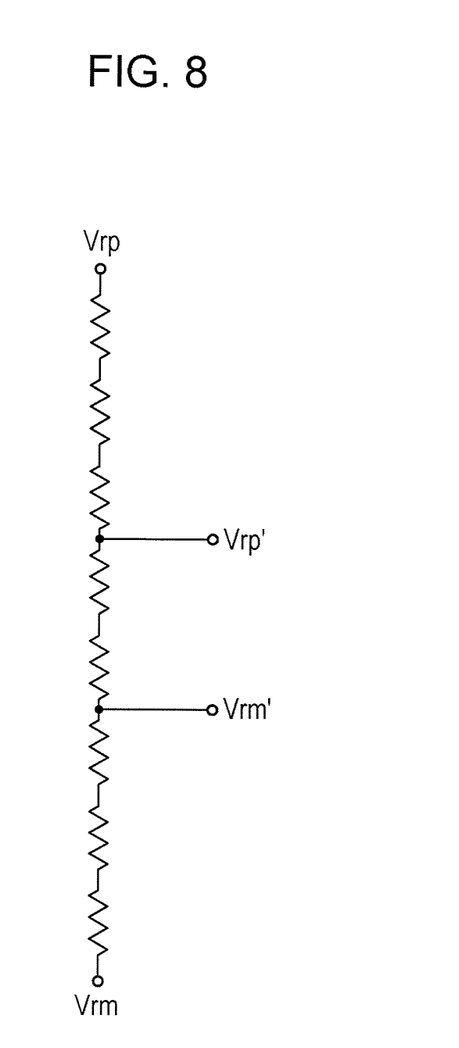
FIG. 8 is a diagram illustrating a circuit that generates reference voltage that is used in a second stage of the ADC illustrated in FIG. 7.

FIG. 7 is a circuit diagram illustrating an ADC (pipelined SAR ADC) according to a third embodiment, and FIG. 8 is a diagram illustrating an example of a circuit that generates reference voltage that is used in the second stage of the ADC illustrated in FIG. 7.

As is apparent from a comparison of FIGS. 3 and 7, a second AD conversion unit 2 according to the third embodiment does not includes the above-described capacitor C20 according to the second embodiment, and positive reference voltage Vrp' and negative reference voltage Vrm' of the second AD conversion unit 2 are different from positive reference voltage Vrp and negative reference voltage Vrm of a first AD conversion unit 1.

That is, as illustrated in FIG. 8, the positive reference voltage Vrp' and negative reference voltage Vrm' that are used in the second AD conversion unit 2 are generated by using voltage dividing resistors so as to apply the positive reference voltage Vrp and the negative reference voltage Vrm to the both ends of the circuit.

Therefore, the ADC according to the third embodiment may do without the capacitor C20 in the second AD conversion unit 2, and prepares the positive reference voltage Vrp' and negative reference voltage Vrm' that are specifically used for the second AD conversion unit 2. This is applied to a third AD conversion unit and the subsequent AD conversion units, and positive reference voltage and negative reference voltage that are specifically used for each of the AD conversion units are to be prepared.

Figure 9:
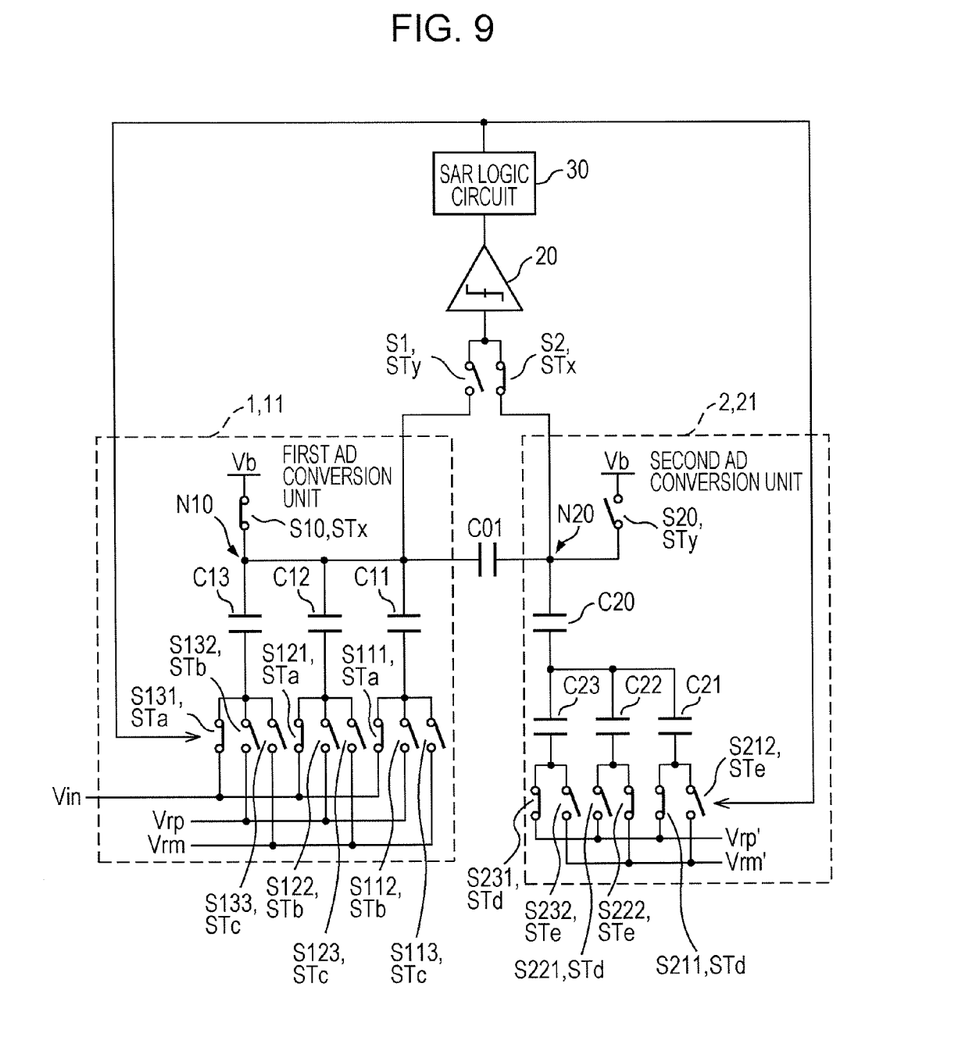
FIG. 9 is a circuit diagram illustrating an ADC according to a fourth embodiment.
Figure 10:
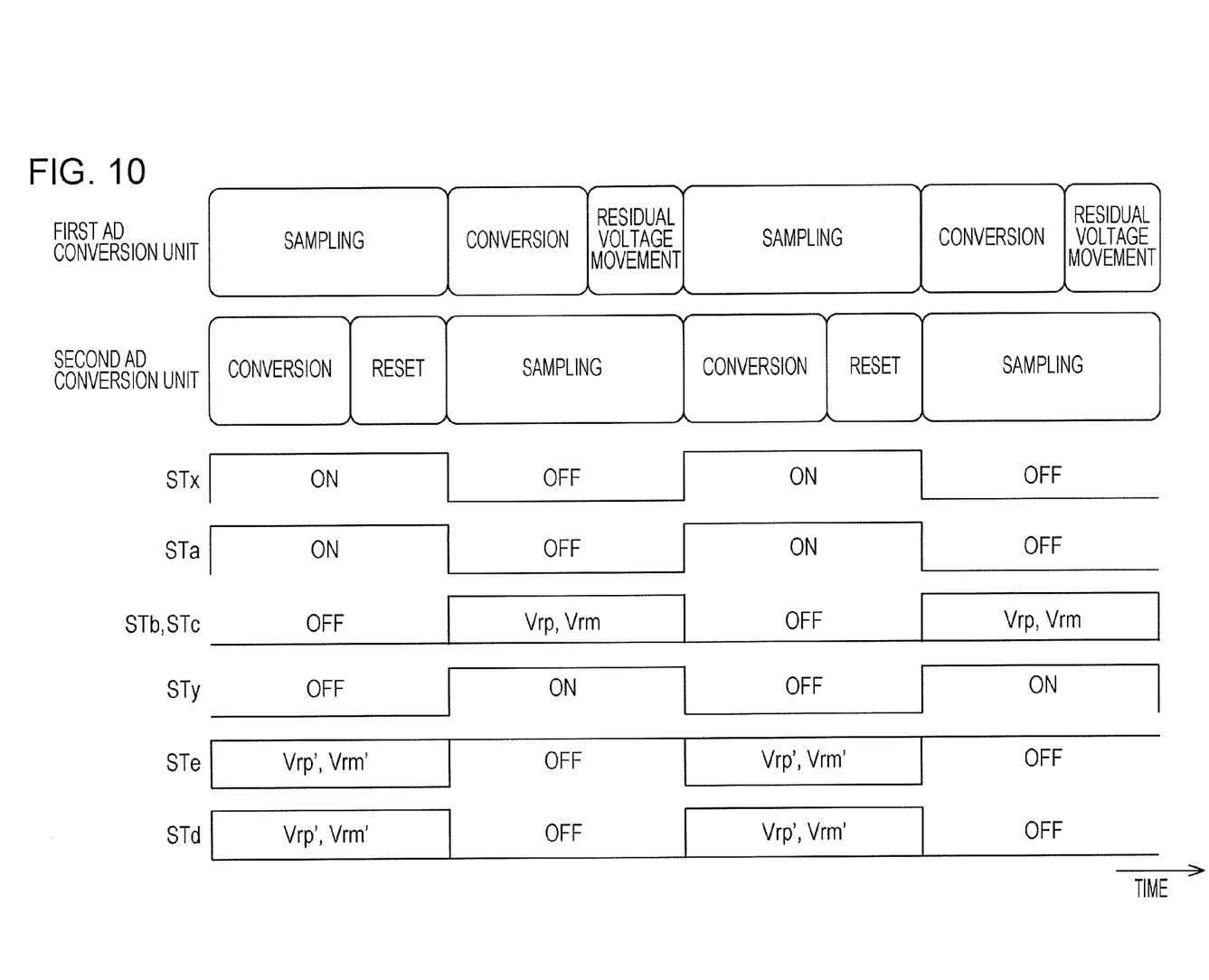
FIG. 10 is a timing diagram illustrating an operation of the ADC illustrated in FIG. 9.

FIG. 9 is a circuit diagram illustrating an ADC (pipelined SAR ADC) according to a fourth embodiment, and FIG. 10 is a timing diagram illustrating an operation of the ADC illustrated in FIG. 9.

As illustrated in FIG. 9, in the ADC according to the fourth embodiment, a first AD conversion unit 1 merely includes a capacitor DAC 11, a second AD conversion unit 2 merely includes a capacitor DAC 21, and a comparator 20 and an SAR logic circuit 30 are used in common.

The shared comparator 20 and SAR logic circuit 30 is selectively connected to the first AD conversion unit 1 (node N10) or the second AD conversion unit 2 (node N20) alternately by switches S1 and S2.

That is, each of the first AD conversion unit 1 and the second AD conversion unit 2 executes the sampling processing, and the conversion and residual voltage movement (reset) processing at different timing (phase), so that the comparator and the SAR logic circuit may be shared.

This is not limited to the first AD conversion unit and the second AD conversion unit, and it is intended that, in two AD conversion units the operations of which are different, the comparator 20 and the SAR logic circuit 30 may be used in common.

For example, the comparator 20 and the SAR logic circuit 30 may be shared between an even-numbered AD conversion unit and an odd-numbered AD conversion unit. However, in consideration of actual wiring, arrangement, and the like, it is desirable that the comparator 20 and the SAR logic circuit 30 are shared between adjacent two AD conversion units.

As illustrated in FIG. 10, in the ADC according to the fourth embodiment, when the first AD conversion unit 1 executes the sampling processing in the sampling state, the second AD conversion unit 2 executes the conversion and reset processing, so that the switch S2 is turned on.

In addition, when the second AD conversion unit 2 executes the sampling processing, the first AD conversion unit 1 executes the conversion and residual voltage movement processing, so that the switch S1 is turned on. Therefore, the switching control is performed on the switch S1 similar to the switch S20 in the second AD conversion unit 2, and the switching control is performed on the switch S2 similar to the switch S10 in the first AD conversion unit 1.

As described above, in the ADC according to the fourth embodiment, the comparator 20 and the SAR logic circuit 30 are shared in the two AD conversion units 1 and 2, so that the circuit size and the footprint may be reduced.

As described above, the first embodiment to fourth embodiment are not limited to the two-stage pipelined SAR ADC and the three-stage pipelined SAR ADC. For example, the first embodiment to fourth embodiment may be also applied to an AD converter that includes two AD conversion units (pipeline stages) and another system of an AD conversion unit that is provided at the upstream or downstream of the two AD conversion units (pipeline stages).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog/digital converter, comprising:
    a first analog/digital conversion unit configured to perform a digital conversion on a received first analog input voltage in a first time period, the first analog/digital conversion unit comprising a first capacitor digital/analog converter;
    a second analog/digital conversion unit configured to perform a digital conversion on a received second analog input voltage in a second time period that is different from the first time period, the second analog/digital conversion unit comprising a second capacitor digital/analog converter; and
    a first coupling capacitor configured to connect the first analog/digital conversion unit and the second analog/digital conversion unit,
    wherein the second analog/digital conversion unit is configured to receive, through the first coupling capacitor, a first residual voltage that is a remaining voltage of the first analog input voltage, as the second analog input voltage, and
    wherein the second capacitor digital/analog converter is configured to:
        include a reference voltage adjustment capacitor configured to connect to the first coupling capacitor in series, and
        use a reference voltage that is common with the first capacitor digital/analog converter.

2. The analog/digital converter according to claim 1, wherein the second analog/digital conversion unit is configured to perform a digital conversion on lower bits that follow bits on which the digital conversion is performed in the first analog/digital conversion unit.

3. The analog/digital converter according to claim 1, wherein, in the first time period, when the first analog/digital conversion unit is configured to execute a movement processing of the first residual voltage to the first coupling capacitor after executing the digital conversion processing of the first analog input voltage, the second analog/digital conversion unit executes a sampling processing of the first residual voltage that is held in the first coupling capacitor, and
    in the second time period, when the first analog/digital conversion unit is configured to execute a sampling processing of the first analog input voltage, the second analog/digital conversion unit is configured to execute a digital conversion processing of the first residual voltage.

4. The analog/digital converter according to claim 3, wherein, in the second time period, when the second analog/digital conversion unit is a last analog/digital conversion unit, the second analog/digital conversion unit is configured to execute a reset processing after executing the digital conversion processing of the first residual voltage.

5. The analog/digital converter according to claim 1, wherein each of the first and second analog/digital conversion units includes:
    the first and second capacitor digital/analog converters, respectively, each of the capacitor digital/analog converter comprising a plurality of capacitors and a plurality of switches,
    a comparator configured to compare voltages output by each of the first and second capacitor digital/analog converters, and
    a logic circuit configured to receive a comparison result of the comparator, control the plurality of switches of each of the first and second capacitor digital/analog converters, and output a digital signal.

6. The analog/digital converter according to claim 5, wherein the second capacitor digital/analog converter in the second analog/digital conversion unit is configured to use a reference voltage that is different from a reference voltage of the first capacitor digital/analog converter in the first analog/digital conversion unit.

7. The analog/digital converter according to claim 1, further comprising:

a k−1th analog/digital conversion unit configured to perform a digital conversion on a received k−1th analog input voltage;

a kth analog/digital conversion unit configured to perform a digital conversion on a received kth analog input voltage; and a k−1th coupling capacitor configured to connect the k−1th analog/digital conversion unit and the kth analog/digital conversion unit, in a case in which k is 3 or more of an integer, wherein the kth analog/digital conversion unit is configured to receive, through the k−1th coupling capacitor, a k−1th residual voltage that is a remaining voltage of the k−1th analog input voltage, as the kth analog input voltage.

8. The analog/digital converter according to claim 7, wherein the kth analog/digital conversion unit is configured to perform a digital conversion on lower bits that follow bits on which the digital conversion is performed in the k−1th analog/digital conversion unit.

9. The analog/digital converter according to claim 7, wherein, in a time period, when the k−1th analog/digital conversion unit is configured to execute a movement processing of the k−1th residual voltage to the k−1th coupling capacitor after executing a sampling processing of the k−1th analog input voltage, the kth analog/digital conversion unit is configured to execute a digital conversion processing of the k−1th residual voltage.

10. The analog/digital converter according to claim 9, wherein when the kth analog/digital conversion unit is a last analog/digital conversion unit, the kth analog/digital conversion unit is configured to execute a reset processing after executing the digital conversion processing of the k−1th residual voltage.

11. The analog/digital converter according to claim 7, wherein each of the k−1th and kth analog/digital conversion units includes:

a capacitor digital/analog converter comprising a plurality of capacitors and a plurality of switches, a comparator configured to compare voltages output by the capacitor digital/analog converter, and a logic circuit configured to receive a comparison result of the comparator, control the plurality of switches of the capacitor digital/analog converter, output a digital signal.

12. The analog/digital converter according to claim 11, wherein the capacitor digital/analog converter in the kth analog/digital conversion unit is configured to use a reference voltage that is different from a reference voltage of the capacitor digital/analog converter in the k−1th analog/digital conversion unit.

13. The analog/digital converter according to claim 11, wherein the capacitor digital/analog converter in the kth analog/digital conversion unit includes a reference voltage adjustment capacitor that is connected to the k−1th coupling capacitor, in series, and the capacitor digital/analog converter in the kth analog/digital conversion unit uses is configured to use a reference voltage that is common with the capacitor digital/analog converter in the k−1th analog/digital conversion unit.

14. The analog/digital converter according to claim 11, wherein the comparator and the logic circuit are shared between the two analog/digital conversion units that perform the digital conversion processing at different time periods.

15. The analog/digital converter according to claim 14, wherein the analog/digital conversion units between which the comparator and the logic circuit are shared are adjacent two analog/digital conversion units, and the comparator and the logic circuit are switched in the different time periods by switches, and shared between the adjacent two analog/digital conversion units.

16. The analog/digital converter according to claim 15, wherein the first analog/digital conversion unit corresponds to a first stage that receives an input analog signal from outside of the converter.

17. The analog/digital converter according to claim 15, further comprising:

a logic circuit unit configured to receive an output of the logic circuit in each of the analog/digital conversion units and output a digital signal that is obtained by performing a digital conversion on the input analog signal.

18. The analog/digital converter according to claim 1, wherein the analog/digital converter is a pipelined successive approximation register analog/digital converter.

* * * * *